United States Patent [19]
Esaki et al.

[11] 4,395,722
[45] Jul. 26, 1983

[54] HETEROJUNCTION TRANSISTOR

[75] Inventors: Leo Esaki, Chappaqua; Chin A. Chang, Peekskill, both of N.Y.

[73] Assignee: The United States of America as represented by the Secretary of the Army, Washington, D.C.

[21] Appl. No.: 198,904

[22] Filed: Oct. 21, 1980

[51] Int. Cl.³ .................. H01L 29/88; H01L 29/72
[52] U.S. Cl. ........................... 357/16; 357/12; 357/34
[58] Field of Search ........................ 357/12, 16, 34

[56] References Cited

U.S. PATENT DOCUMENTS

| | | | |
|---|---|---|---|
| 3,225,272 | 12/1965 | Cronemeyer | 357/12 OR |
| 3,358,158 | 12/1967 | Tiemann | 357/4 X |
| 3,864,721 | 2/1975 | Cohen | 357/12 X |
| 4,119,994 | 10/1978 | Jain et al. | 357/34 X |
| 4,173,763 | 11/1979 | Chang et al. | 357/12 OR |
| 4,371,884 | 2/1983 | Esaki et al. | 357/12 OR |

OTHER PUBLICATIONS

W. P. Dumke, J. M. Woodall and V. L. Rideout, "GaAs–GaAlAs Heterojunction Transistor for High Frequency Operation", *Solid-State Electronics*, vol. 15 (1972) pp. 1339–1343.

L. L. Chang and L. Esaki, "Tunnel Triode–A Tunneling Base Transistor" *Applied Physics Letters*, vol. 31 (1977) pp. 687–689.

C. A. Chang and L. Esaki, "GaSb–InAs–GaSb p-n-p Heterojunction Transistors for Ultra–High Speeds", *IBM Technical Disclosure Bulletin*, vol. 22 (1979) p. 2952.

*Primary Examiner*—James W. Davie
*Assistant Examiner*—J. Carroll
*Attorney, Agent, or Firm*—Robert P. Gibson; Jeremiah G. Murray; Anne Vachon Dougherty

[57] ABSTRACT

A heterojunction transistor device having emitter and collector regions of a first conductivity type separated by an ultra-thin base region of a second conductivity type. Abrupt heterojunctions are formed which are then heat treated to allow the formation of graded heterojunctions exhibiting rectifying characteristics. Typically, the emitter and collector regions are comprised of GaSb while said base region is comprised of InAs. The band gap of the emitter region is selectively chosen to be relatively wide in comparison to the band gap of the base region. Moreover, the band gap of the emitter and collector regions is substantially equal to the conduction band discontinuity between the emitter and base, and the band gap of the base is substantially equal to the valance band discontinuity and the edge of the conduction band of the base region is substantially coincident with the edge of the valance band of the emitter region. The base region is heavily doped to reduce the base resistance thereby maintaining an injection efficiency close to unity.

11 Claims, 3 Drawing Figures

HETEROJUNCTION TRANSISTOR

The invention described herein may be manufactured and used by or for the Government for governmental purposes without the payment of any royalties thereon or therefor.

BACKGROUND OF THE INVENTION

1. Field of the Invention

This invention relates to high speed semiconductor devices and more particularly to a heterojunction transistor with an ultra-thin base region which can be heavily doped to reduce the base resistance.

2. Description of the Prior Art

In U.S. Pat. No. 4,173,763, entitled "Heterojunction Tunneling Base Transistor" issued to Leroy L. Chang, et al. on Nov. 6, 1979, there is disclosed a heterojunction semiconductor device having emitter, base and collector regions separated by heterojunctions with the base region having a thickness in the order of 100 Å so that charge carriers can tunnel therethrough. One of the characteristics of this device is that the energy gaps of the emitter and collector regions are shifted in the same direction with respect to the energy gap of the base region and overlap with the energy gap of the base region, i.e. both the valence band and the conduction band in the emitter and collector regions are shifted in the same direction with respect to the valence band and conduction band of the base region. This provides a conduction band edge discontinuity which establishes a potential barrier against charge transfer from the emitter to the base region. Additionally, the band gap structure as described provides a valence band discontinuity which isolates the base region from both the emitter region and the collector region, meaning that majority carriers in the base region are trapped in a potential well so that they cannot easily move to either the emitter or collector for recombination with opposite type charge carriers. Moreover, the base region is heavily doped which means that its base resistance is low.

In the present invention, a heterojunction transistor is described which does not use the tunneling mechanism mentioned above. A special treatment of the junction interface is involved which, combined with the use of a wide-gap emitter and heavily doped, ultra-thin base layer, results in ultra-high speed operation.

Accordingly, it is an object of the present invention to provide an improved high speed semiconductor device of the heterojunction type.

SUMMARY

Briefly, the subject invention is directed to a semiconductor device having emitter, base, and collector regions separated by heterojunctions. The heterojunctions are heat treated so that graded heterojunctions exhibiting rectifying characteristics are formed. The constituent materials are selected such that the band gap of the emitter is relatively large with respect to the band gap of the base region. Furthermore, the band gap of the emitter and collector regions is substantially equal to the conduction band discontinuity between adjacent regions and the band gap of the base region is substantially equal to the valence band discontinuity between adjacent regions. For an p-n-p device, the edge of the conduction band of the base region is substantially coincident with the edge of the valence band of the emitter and collector regions. Furthermore, the base region is heavily doped so that the Fermi level exists within the conduction band region while the emitter and collector regions are less heavily doped so that Fermi levels thereof exist in proximity to the edge of the valence band.

DESCRIPTION OF THE PREFERRED EMBODIMENT

Figure 1:
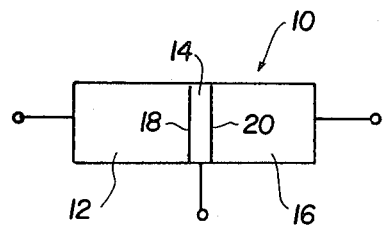
FIG. 1 is a schematic representation of the device in accordance with the subject invention.

Referring now to FIG. 1, reference numeral 10 is intended to designate a heterojunction device having three semiconductor regions 12, 14 and 16 which can be characterized as the emitter, base and collector regions, respectively. The emitter and collector regions have a first conductivity type, while the base region has the opposite conductivity type with the base-emitter junction 18 and the base-collector junction 20 consisting of heterojunctions. Although the present invention is not intended to be limited as such, particularly suitable materials for fabricating such a device are p-GaSb and n-InAs.

In order to provide atomically smooth surfaces and extremely sharp boundaries at the heterojunctions 18 and 20, an epitaxial process known as molecular beam epitaxy (MBE) comprises one well known process for providing well defined multi-layer heterostructures of high quality in a controlled manner and one in which the base region can be controlled so that its thickness is in the order of several hundred Å. The thickness of the emitter and collector regions 12 and 16 are not critical and can be of any operative desired magnitude.

The p-GaSb and n-InAs heterojunctions thus formed are ohmic. They are made rectifying junctions by a controlled heat treatment at a relatively high temperature (550° C.–700° C.) which allows diffusion of the materials and makes the junction interfaces graded. The precisely controlled thin base region results in an extremely short base transit time and is heavily doped to reduce the base resistance. These characteristics combined with the use of a wide band gap emitter as described below provides a GaSb-InAs-GaSb p-n-p ultra high-speed transistor.

Figure 2A:
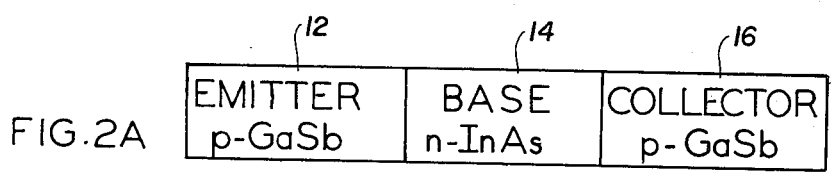
FIG. 2A is a schematic representation of a p-n-p device according to the subject invention fabricated from GaSb and InAs.
Figure 2B:
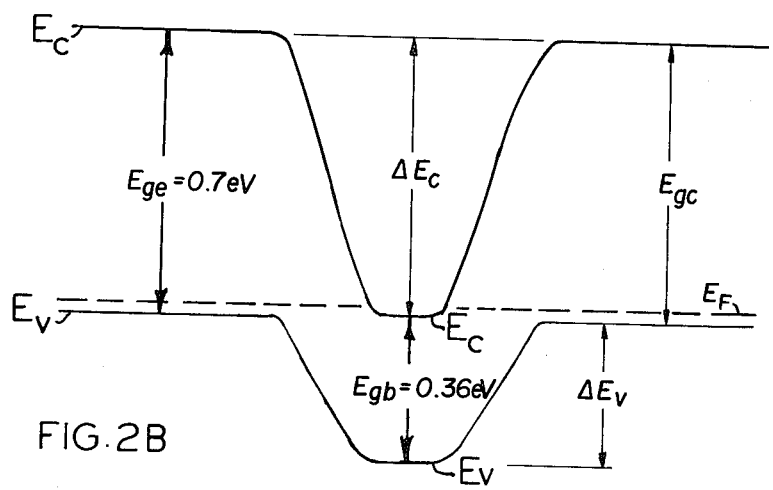
FIG. 2B is a diagram illustration of the energy band characteristic of the device shown in FIG. 2A.

Referring now to FIGS. 2A and 2B, there is disclosed an embodiment of a p-n-p heterojunction transistor having a predetermined energy band characteristic which makes it particularly adaptable for high speed applications. In FIG. 2A, the emitter and collector regions 12 and 16 are shown comprised of p-type GaSb while the base of region 14 is comprised of n-type InAs. As shown in the energy band diagram of FIG. 2B, the constituent materials of the subject invention are selectively chosen to provide energy bands wherein the energy band gaps $E_{ge}$ and $E_{gc}$ of the emitter and collector regions, respectively, are shifted with respect to the energy band gap $E_{gb}$ of the base region. As is well shown, these energy band gaps exist between the edge of the conduction band $E_c$ and the edge of the valence band $E_v$ as shown in FIG. 2B. In the p-n-p structure disclosed, moreover, the energy bands of the emitter and collector are shifted upward with respect to the energy band of the base region. Additionally, the energy band gap $E_{ge}$ of the emitter region 12 at least is made relatively large in comparison with the energy band gap $E_{gb}$ of the beam region. In a preferred embodiment, the electron injection barrier which corresponds to the energy band gap $E_{ge}$ of the emitter region 12 is in the order of 0.7 eV while the hole injection barrier which constitutes the energy band gap $E_{gb}$ for the base region is in the order of 0.36 eV. Such a relationship results in an energy band characteristic wherein the edge of the conduction band $E_c$ of the base region 14 is substantially coincident with the edge of the valence band $E_v$ of the emitter and collector regions 12 and 16 and accordingly the energy band gap of the emitter and collector is substantially equal to the conduction band discontinuity $\Delta E_c$ between the emitter, collector and base and the energy band gap of the base is substantially equal to the valence band discontinuity $\Delta E_v$. This barrier configuration results in a structure which can include a heavily doped base region 14 to reduce the base resistance while maintaining an injection efficiency close to unity. Accordingly, the present invention additionally contemplates a doping concentration in the order of $10^{19}$ cm$^{-3}$ indicated by the Fermi level $E_F$ (FIG. 2B) whereupon the base region 14 has a Fermi level in the conduction band region $E_c$ while the emitter and collector regions are doped so that the Fermi levels thereof exist in the vicinity of the valence band edge $E_v$.

Thus what has been shown and described is a device which meets all the requirements for a high speed transistor. Further, the device can be used for many different purposes including amplification, oscillation and switching. Such uses and biasing which would be required for such uses are well known to those skilled in the art. Thus, all modifications and alterations coming within the spirit and scope of the present invention as defined in the appended claims are herein meant to be included.

What is claimed is:

1. A high speed semiconductor device comprising: first, second and third semiconductor regions of a binary alloy, said second region having a different alloy composition and conductivity type than said first and third regions, said second region being degenerately doped;

said second region located between said first and third regions, the interfaces between said first and second regions, and between said second and third regions being graded bandgap rectifying heterojunctions composed of a quaternary alloy semiconductor layer having the same alloy constituents as the adjacent regions;

each region having an energy band gap defined by conduction and valence band gap edges, said band gap of said first region being substantially larger than said band gap of said second region, said band gaps of said first and third regions being shifted in the same direction with respect to said band gap of said second region; and one of the band gap edges of said first region being substantially coincident with one of the band gap edges of said second region, whereby said band gap in said second region forms a potential barrier to majority carriers in said first and second regions that is substantially smaller than the potential barriers formed by said band gap in said first and third regions.

2. A high speed semiconductor device as defined by claim 1 wherein said second region has a width of several hundred angstroms.

3. A high speed semiconductor device as defined by claim 1 wherein said band gaps of said first and third region are similar.

4. A high speed semiconductor device as defined by claim 3 wherein the Fermi level of said semiconductor is substantially coincident with the conduction band gap edge of said second region.

5. The semiconductor device as defined by claim 1 wherein the energy band gap of said first region is approximately twice the energy band gap of said second region.

6. The semiconductor device as defined by claim 5 wherein the energy band gap of said first region is at least substantially 0.7 eV and the energy band gap of said second region is at least substantially 0.36 eV.

7. The semiconductor device as defined by claim 1 wherein said second region has a larger dopant concentration than said first or third regions.

8. The semiconductor device as defined by claim 1 wherein said second region is comprised of n-InAs and said first and third regions are comprised of p-GaSb.

9. A high speed transistor comprising:
   a semiconductor emitter region of a first conductivity type;
   a semiconductor base region of a second conductivity type;
   a semiconductor collector region of said first conductivity type;
   said emitter, base and collector regions composed of binary alloys
   said base region being degenerately doped, having a different alloy composition than said emitter and collector regions;
   said base region being located between said emitter and collector regions the emitter-base and base-collector interfaces being graded rectifying heterojunctions composed of quarternary alloy semiconductor layers having the same alloy constituents as the adjacent regions;
   said emitter and collector regions having energy band gaps each of which is shifted in the same direction with respect to the energy band gap of said base region, said band gap of emitter being substantially larger than said band gap of said base, and
   one of the band gap edges of said emitter being substantially coincident with one of the band gap edges of said base, whereby said band gap in said base forms a potential barrier to majority carriers in said emitter and collector regions that is substantially smaller than the potential barriers formed by said band gaps in said emitter and collector regions.

10. The semiconductor device as defined by claim 9 wherein said emitter and collector regions are comprised of p type GaSb and said base region is comprised of n type InAs.

11. The semiconductor device as defined by claim 9 wherein said emitter, base and collector regions are comprised of epitaxial layers.

* * * * *